US 6,788,991 B2

(12) United States Patent
De Haas et al.

(10) Patent No.: US 6,788,991 B2
(45) Date of Patent: Sep. 7, 2004

(54) DEVICES AND METHODS FOR DETECTING ORIENTATION AND SHAPE OF AN OBJECT

(75) Inventors: Martien Johan De Haas, Hoogland (NL); Hermanus Jozef Clemens Maria Terhorst, Amersfoort (NL); Erik Ter Vrugt, Rheden (NL); Theo De Keyzer, Lienden (NL)

(73) Assignee: ASM International N.V., Bilthoven (NL)

( * ) Notice: Subject to any disclaimer, the term of this patent is extended or adjusted under 35 U.S.C. 154(b) by 0 days.

(21) Appl. No.: 10/268,138

(22) Filed: Oct. 9, 2002

(65) Prior Publication Data

US 2004/0073328 A1 Apr. 15, 2004

(51) Int. Cl.⁷ .............................. G06F 19/00; B23Q 3/00
(52) U.S. Cl. .................... 700/121; 700/112; 269/20
(58) Field of Search ......................... 700/56, 112, 121, 700/192; 438/975; 29/650; 361/807, 809; 269/20

(56) References Cited

U.S. PATENT DOCUMENTS

| | | | |
|---|---|---|---|
| 4,618,292 A | 10/1986 | Judge et al. | |
| 4,738,748 A | 4/1988 | Kisa | |
| 4,860,687 A | 8/1989 | Frijlink | ........................ 118/500 |
| 5,264,918 A | 11/1993 | Kagami | |
| 5,729,337 A | 3/1998 | Tanaka | |
| 5,768,125 A | 6/1998 | Zinger et al. | |
| 5,844,683 A | 12/1998 | Pavloski et al. | |
| 5,885,353 A | 3/1999 | Strodtbeck et al. | |
| 5,961,169 A | 10/1999 | Kalenian et al. | |
| 6,051,074 A | 4/2000 | Strodtbeck et al. | |
| 6,082,950 A | 7/2000 | Altwood et al. | |
| 6,086,064 A | 7/2000 | Biegelsen et al. | |
| 6,090,209 A | 7/2000 | Strodtbeck et al. | |
| 6,099,596 A | 8/2000 | Li et al. | |
| 6,111,225 A | 8/2000 | Ohkase | ........................ 219/390 |
| 6,131,589 A | 10/2000 | Vogtmann et al. | |
| 6,167,322 A | 12/2000 | Holbrooks | |
| 6,183,565 B1 | 2/2001 | Granneman et al. | ........ 118/725 |
| 6,197,117 B1 | 3/2001 | Li et al. | |
| 6,220,945 B1 | 4/2001 | Hirokawa | |
| 6,242,718 B1 * | 6/2001 | Ferro et al. | .................. 219/405 |
| 6,267,642 B1 | 7/2001 | Vogtmann et al. | |
| 6,280,291 B1 * | 8/2001 | Gromko et al. | ................. 451/8 |
| 6,327,517 B1 | 12/2001 | Sundar | |
| 6,341,769 B1 * | 1/2002 | Lin et al. | ........................ 269/21 |
| 6,403,933 B1 * | 6/2002 | Strodtbeck et al. | ......... 219/502 |
| 6,405,740 B1 * | 6/2002 | Vogtmann et al. | .......... 134/153 |
| 6,419,216 B1 * | 7/2002 | Susnjara | ........................ 269/21 |
| 6,663,466 B2 * | 12/2003 | Chen et al. | ..................... 451/8 |
| 2002/0052052 A1 | 5/2002 | Robinson et al. | |

FOREIGN PATENT DOCUMENTS

| | | |
|---|---|---|
| JP | 361125038 A | 11/1984 |
| JP | 63-136532 | 8/1988 |
| JP | 403012946 A | 1/1991 |
| WO | WO 00/42638 | 1/2000 |
| WO | WO 00/68977 | 5/2000 |

* cited by examiner

Primary Examiner—Leo Picard
Assistant Examiner—Elliot Frank
(74) Attorney, Agent, or Firm—Knobbe, Martens, Olson & Bear, LLP

(57) ABSTRACT

Embodiments of the present invention provide a system and method for receiving and dropping-off a horizontally oriented flat substrate, for example a semiconductor wafer, on a substrate support structure and verifying the correct positioning and orientation (level) of the substrate. Additional embodiments provide a system and method for indicating the presence or absence, orientation and concavity or convexity of a substrate.

55 Claims, 7 Drawing Sheets

DEVICES AND METHODS FOR DETECTING ORIENTATION AND SHAPE OF AN OBJECT

FIELD OF THE INVENTION

The present invention is related to sensing devices and, more particularly, to systems and methods for sensing the presence, position, shape and/or orientation of an object.

BACKGROUND OF THE INVENTION

When locating, manipulating and fabricating semiconductor substrates or wafers, it is frequently necessary for a machine to determine whether a wafer is present at a particular location, and if so, its characteristics. In the prior art, there are many ways to make such a determination. One method includes measuring the position of the wafer on an end effector before the wafer is placed on a susceptor or other destination. Another method includes measuring the presence or absence of a wafer after it has arrived at its destination. Some systems employ optical detection devices, others make use of fluid pressure differentials. In any event, the solutions present in the prior art are not satisfactory for wafer sensing, positioning or characterization.

One example of an optical sensing system is provided in U.S. Pat. No. 5,768,125 by Zinger et al ("Zinger"). In Zinger, an apparatus for transferring a substantially circular article from a first position to a second position compensates for misalignment of the article on a support arm. During movement of the support arm, the periphery of the circular article is detected and a correction of the movement of the support arm is generated. Zinger's preferred embodiment employs a light detector in order to determine the object's position. The light detector is comprised of a linear array of optical sensors, each sensor comprising a light emitting diode ("LED") and a light detecting photodiode. Light emitted from each LED is blocked as the object moves between the LED and the photodiode. The sensor registers this light blockage and sends a signal to a calculating means. In turn, the calculating means receives this data, and determines the wafer's position and velocity, and repositions the wafer through manipulation of the support arm, as necessary.

Optical detection as described by Zinger is typically used to detect the lateral position of a flat substrate or semiconductor wafer. The vertical position of a horizontally oriented wafer and the alignment of such a wafer with respect to a support surface is significantly more complicated to accurately detect through optical detection. Consequently, optical detection is not favored for vertical positioning of horizontally oriented wafers, or for other similar applications.

U.S. Pat. No. 6,086,064 by Biegelsen et al. ("Biegelsen") discloses a different method for detecting a wafer's position. In Biegelsen, an object detection apparatus uses a pressurized fluid source and an interruptible jet sensor to determine the presence or absence of a wafer. In the preferred embodiment, a fluid jet flows across a gap towards a sensing port. When an object is present in the gap, the fluid jet is interrupted and a pressure change is detected and registered.

U.S. Pat. No. 6,280,291 by Gromko et al. ("Gromko") discloses a wafer holder with a wafer presence sensor that makes use of a hydrodynamic pressure differential technique. In the preferred embodiment, a wafer sensor comprises a wafer holder, a liquid distribution system and a pressure sensor. The wafer holder is provided with a liquid distribution system comprising a central supply conduit in communication with a series of fluid passages opening up at a wafer support surface of the wafer holder. The wafer holder is configured such that, when a wafer is placed in the wafer holder the wafer covers the fluid passages, thereby restricting the flow of liquid from the liquid distribution system through the fluid passages. The liquid distribution system is provided with a pressure sensor to sense the pressure of fluid in the supply conduits supplying fluid to the passages. When the wafer holder holds a wafer, the restricted flow through the fluid passages causes an increase in pressure within the central supply conduit. The increase in pressure beyond a predefined threshold is detected by the pressure sensor and indicates that a wafer is present.

U.S. patent application Ser. No. 09/875,277 by Kuznetsov et. al., entitled APPARATUS FOR PROCESSING A WAFER, discloses an apparatus that comprises a support structure which manipulates a wafer during processing and an optical measuring means that determines the lateral position of the wafer prior to and during processing. In the preferred embodiment, the support structure is provided with at least one fluid supply channel opening at a wafer support surface of the support structure. This support structure provides fluidic support of the wafer during processing.

There are a many disadvantages inherent in the various positioning and detection solutions present within the prior art. In optical systems for example, the accuracy of the optical measurements depends on how well the position of these optical components are known. Currently, these optical systems are positioned using complicated mechanical means, which are not always accurate. Moreover, typical in line wafer centering systems are rather complex and expensive, and require many sensors to be accurately positioned. In addition, optical detection is difficult and frequently inaccurate. Likewise, typical fluid detection systems also leave much to be desired. Specifically, typical fluid detection systems detect only the presence or absence of an object. However, there are many applications where the measurement of a correct positioning of an object or a correct alignment of an object with respect to supporting plane is desirable in order to prevent damage to or loss of objects.

SUMMARY OF THE INVENTION

Accordingly, it is an objective of the present invention to provide a device and method to detect the presence, position, orientation and/or alignment of an object with respect to a supporting plane. It is another objective of the present invention to provide a device and method to determine the mechanical integrity and flatness of an object in order to prevent processing of objects that could damage a processing tool.

In satisfaction of these objectives, embodiments of the present invention provide devices and methods for receiving and depositing a substrate on a substrate support structure and verifying the correct shape, position and/or orientation of the substrate.

According to a first aspect of the invention, a substrate support and sensing apparatus for use in semiconductor processing is provided with a first substrate support structure, including at least one fluid channel configured to supply fluid to an underside of a substrate supported over the first support structure. At least one sensor is configured to measure a property of gas flow beneath the supported substrate and provide a signal indicative of the value of said property. A controller monitors the signal generated by the sensor and produces an indication of whether the substrate is oriented level relative to the first support structure.

In one embodiment, the first support structure comprises a table with three support pins having gas injection channels therein. The substrate is transferred from the first support structure to a second support structure (a support ring) by raising the second support structure or lowering the first support structure. A pressure sensor in each channel measures pressure while the second support structure supports the substrate over the first support structure, the pressures being correlated to distances from each of the support pins to the substrate.

In another embodiment, the first support structure comprises a plurality of gas ports providing a supporting gas cushion beneath the substrate. A separate channel is provided to sense pressure in a gap between the first support structure and the substrate supported thereover, the pressure being correlated with how level the substrate is relative to the first support structure and/or the curvature of the substrate.

According to a second aspect of the invention, a method of supporting and sensing a substrate for use in semiconductor processing is provided. The method includes supporting a substrate over a first support structure, which includes at least one fluid channel in communication with a gap between the first support structure and an underside of the supported substrate. Fluid flows through the fluid channel. A property of the fluid beneath the supported substrate is measured. The measured property is used to determine one or more of an orientation of the substrate with respect to the first support structure and a shape of the substrate.

According to a third aspect of the invention, a system for sensing the condition of a substrate over a support structure is provided. The system includes a substrate holder having an upper surface extending beneath a substrate supported thereover, the upper surface including a recess configured to accommodate the substrate therein. At least one fluid injection channel breaches the upper surface to inject fluid into a gap between the substrate and upper surface. A fluid pressure sensor is configured to measure pressure beneath the substrate. A controller connects to the pressure sensor and is configured to read the pressure sensed by the pressure sensor. The controller is also configured to compare the sensed pressure to a plurality of empirically determined pressure ranges associated with a corresponding plurality of substrate conditions to thereby determine a condition of the substrate based upon the sensed pressure.

According to a fourth aspect of the invention, a substrate support and sensing apparatus is provided with a first support structure for receiving and supporting a substantially horizontally oriented flat substrate. The first support structure is provided with at least three gas channels, which are configured to inject gas at spaced apart positions against a lower surface of a substrate supported above the first support structure. Each of the gas channels is provided with a sensor configured to generate a sensor signal relating to a property of gas flow through the channel. The apparatus also includes a second support structure, that is vertically movable with respect to the first support structure and configured such that a substrate supported on one of the support structures can be transferred to the other of the support structures. A drive mechanism moves the first and second substrate support structures with respect to each other. The drive mechanism has an encoder to read a vertical position. A controller is connected to the sensors and the encoder. The controller is configured to read, for each of the sensors, the vertical position indicated by the encoder together with the sensor signal, when a predetermined condition is achieved after dropping off the substrate.

In the illustrated embodiments, the systems and methods allow for the determination of the presence or absence of a wafer, its flatness and/or its orientation, through the use of data gathered from fluid pressure sensors.

These and other features and advantages of this invention are described in or are apparent from the following detailed description of the preferred embodiments.

BRIEF DESCRIPTION OF THE DRAWINGS

These and other aspects of this invention will be readily apparent from the detailed description below and the appended drawings, which are meant to illustrate and not to limit the invention, wherein like members bear like reference numerals and wherein.

DETAILED DESCRIPTION OF THE PREFERRED EMBODIMENT

The methods and apparatuses to sense, position and orient an object will now be described with respect to preferred embodiments; however, the methods and systems of the present invention are not limited to the illustrated apparatuses. Rather, the methods and apparatuses can be used in a variety of tools or environments in which it is necessary to detect or place an object, and especially a semiconductor substrate, with a high degree of accuracy. Moreover, the skilled artisan will readily appreciate that the formulas and specific sequences of operation described herein are merely exemplary and that variations can be made without departing from the spirit and scope of the invention.

Figure 1:
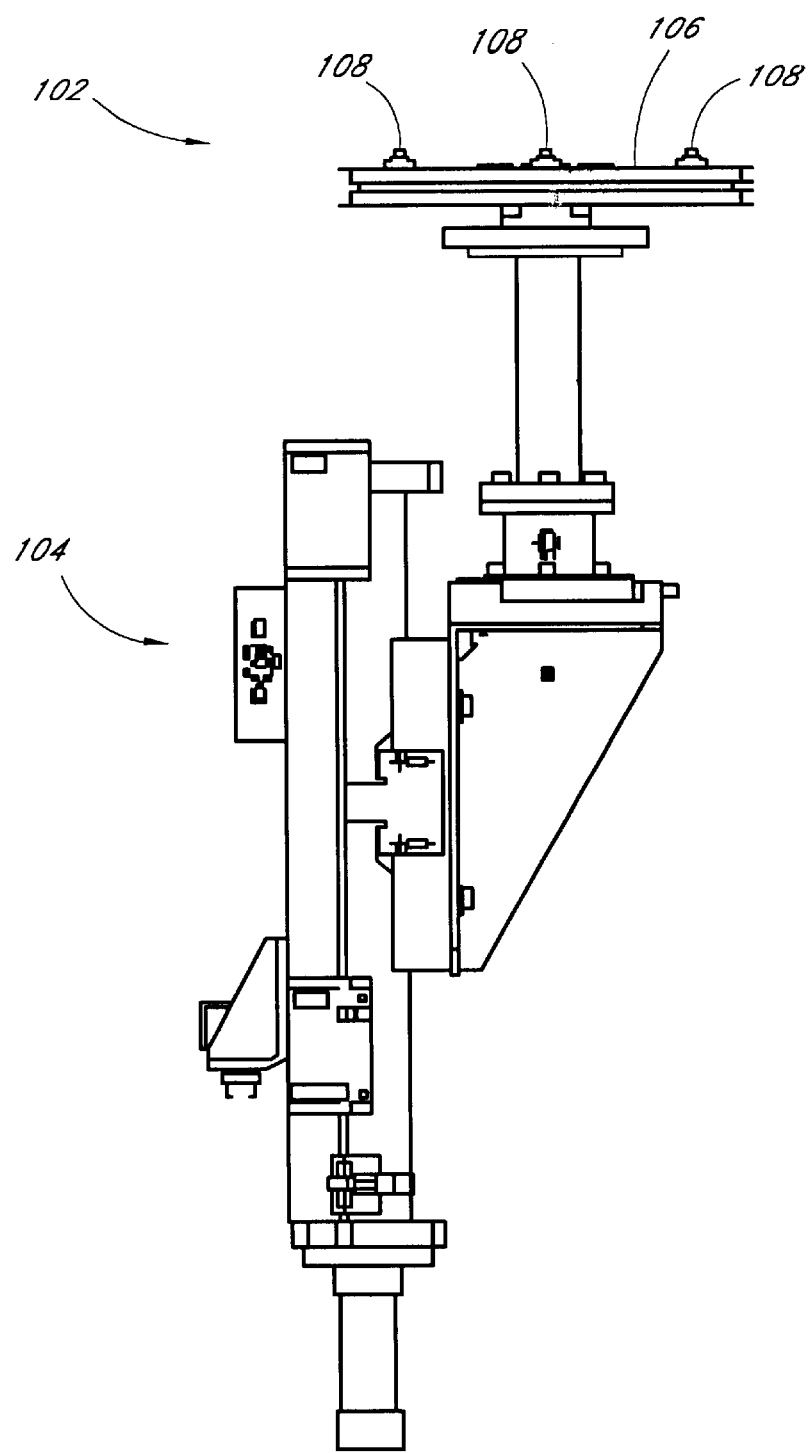
FIG. 1 is a schematic diagram showing a cross-sectional view of a substrate support and sensing apparatus, constructed in accordance with one embodiment of the present invention.

FIG. 1 is a schematic diagram showing a cross-sectional view of a substrate support and sensing apparatus. The substrate support and sensing apparatus comprises a support apparatus 102 coupled to an elevator-robot 104. In the preferred embodiment, the support apparatus 102 is provided with a substrate support table 106, which preferably includes at least one fluid channel (not shown), and more preferably at least three fluid channels. The support table 106 serves, in the exemplary arrangement, both as a sensing structure and as a first support structure. In the illustrated embodiment, each fluid channel terminates through a channeled support pin 108. In the preferred embodiment, three supporting pins 108 are located at the vertices of a triangle on the substrate support table 106, in order to support a semiconductor substrate (not shown) through either physical or fluid communication.

Figure 2:
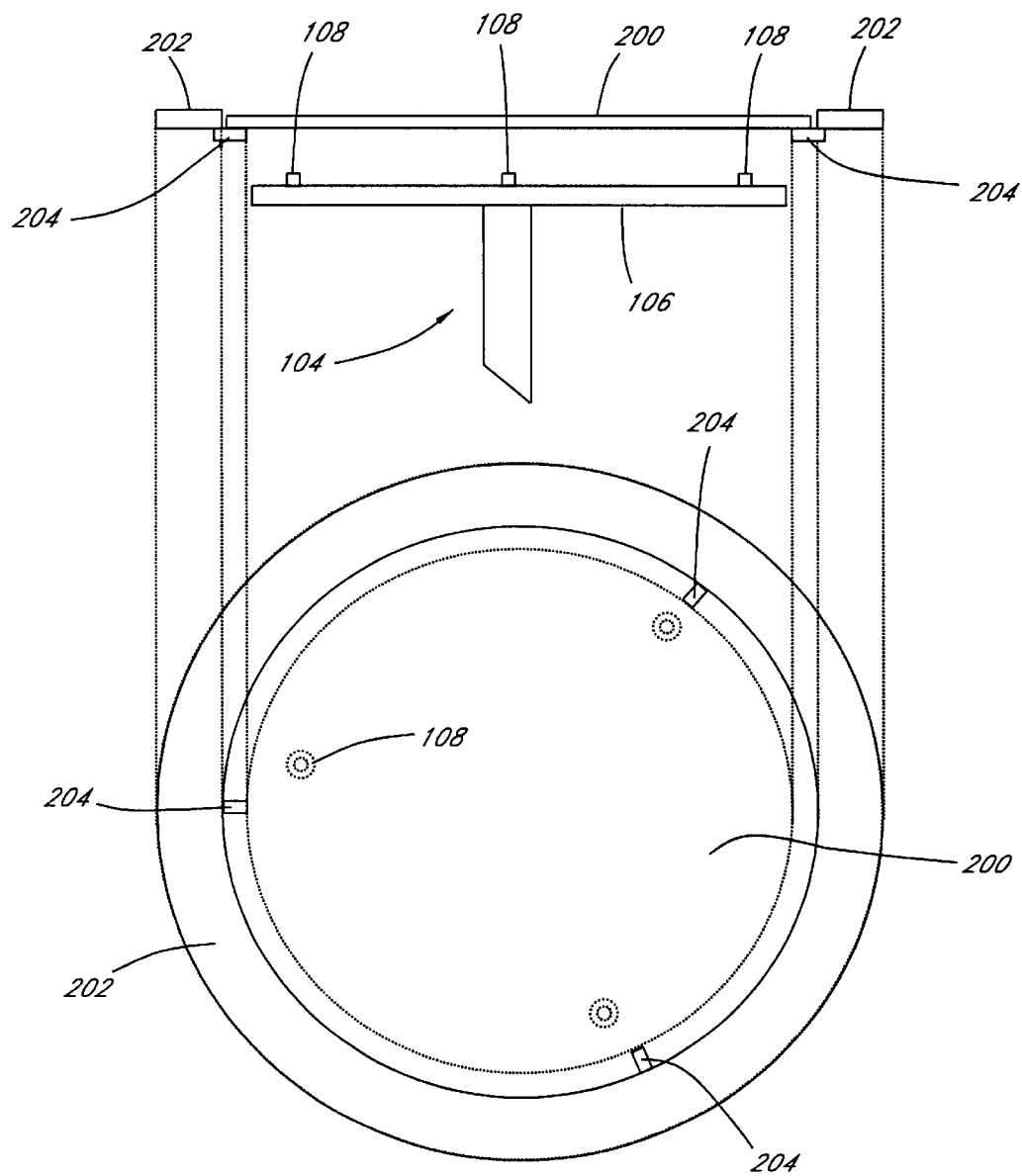
FIG. 2 is a schematic diagram showing a substrate, or wafer, in place within the pocket of a second support structure, or support ring, for use in conjunction with the substrate support and sensing apparatus of FIG. 1, shown in both top and cross-sectional views.

FIG. 2 is a schematic diagram showing a substrate or wafer 200, in place within the pocket of a second support structure, illustrated as a support ring 202, in both top and cross-sectional views. As shown in this figure, the elevator-robot 104 is preferably configured to vertically translate the support structure 102 in order to transfer the substrate 200 between the support table 106 and the support ring 202. In particular, the support table 106 receives a wafer at an input/output station, then lowers the wafer onto the support ring 202, which is employed to transfer the wafer elsewhere (e.g., to a process chamber).

In the preferred embodiment, the support ring 202 is preferably slightly thicker than the wafer 200 and is provided with three rectangular support ledges 204 with which to support the wafer 200. The support ring 202 is preferably moveable and transports the wafer 200 to and from other locations for further processing. Although in the shown example the wafer 200 is deposited on a support ring 202, it should be clear that in alternative embodiments the wafer 200 can be deposited onto any other support structure, whether stationary or moveable, that allows vertical passage of the support table 106 and the wafer 200.

As noted above, the illustrated support ring 202 is designed to transport wafers to and from different treatment chambers within a semiconductor processing apparatus. Such a semiconductor processing apparatus is described in described in International Publication No. WO 00/68977, published Nov. 16, 2000 and entitled METHOD FOR TRANSFERRING WAFERS AND RING, the disclosure of which is hereby incorporated by reference.

Figure 3A:
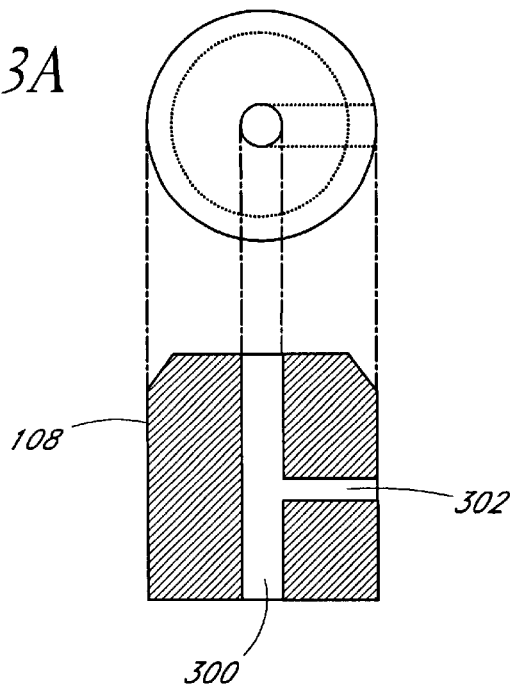
FIGS. 3A, 3B and 3C illustrate, respectively, a channeled support pin, a substrate resting directly upon the channeled support pin and the substrate being supported spaced apart from but proximate to the channeled support pin.
Figure 3B:
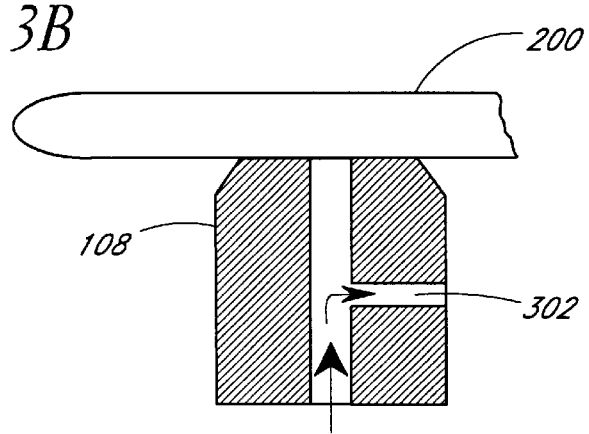
Figure 3C:
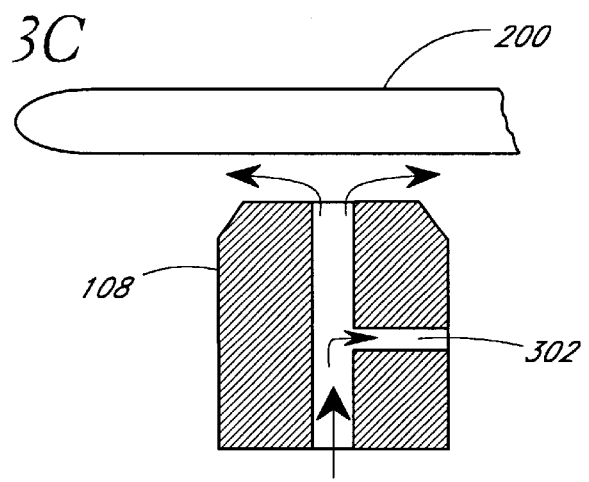

FIG. 3 is a schematic diagram showing the substrate 200 in place above a channeled support pin 108. As shown in FIG. 3A, each support pin 108 is preferably provided with a fluid channel 300 which is connected to a fluid supply (not shown), supplying a constant fluid flow to the fluid channel 300. For this purpose, the fluid is supplied at a constant, stabilized pressure and passes through a defined restriction before entering the channel 300. The fluid channel 300 is configured to inject a jet of fluid beneath the lower surface of the wafer 200. The support pin 108 also preferably has a bleed aperture 302 to prevent lifting of the wafer by the fluid flow. As shown in FIG. 3B, when the wafer 200 is resting on the support pin 108, the fluid flowing into the fluid channel 300 is allowed to leak out the bleed aperture 302, thereby preventing lifting or skating of the from the support pins 108 as the wafer 200 is being lowered to the support ring. As shown in FIG. 3C, when the wafer 200 is suspended above the support pin 108, the fluid flowing into the fluid channel 300 may exit at the top portion of the fluid channel 300 as well as through the bleed aperture 302. As will be apparent to one skilled in the art, it is not necessary to have fluid channels in every supporting pin 108.

Figure 4:
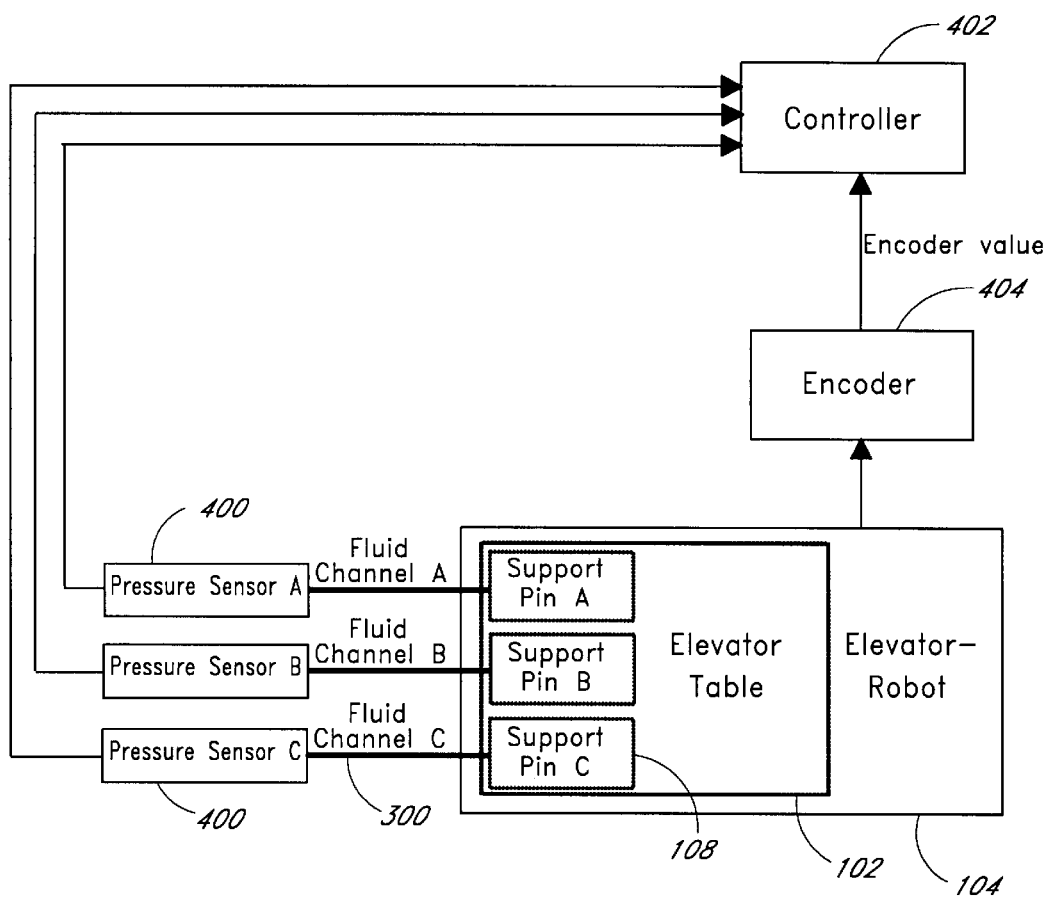
FIG. 4 is a schematic diagram depicting the control structure of one embodiment of the present invention.

FIG. 4 is a schematic diagram depicting the control structure of one embodiment of the present invention. In the preferred embodiment, the fluid channel 300 for each supporting pin 108 is provided with a sensor 400 configured to sense a property of the fluid flow in the fluid channel 300, and in the illustrated embodiment the sensed or measured property comprises pressure. It will be understood in view of the present disclosure that the measured property can comprise a gas flow rate, among other examples. The elevator-robot 104 for the vertically translatable support structure 102 is provided with an encoder 404, which provides encoder values that are indicative of the vertical position of the elevator-robot 104, as will be clarified by the discussion of FIG. 5 below. Each pressure sensor 400 and the elevator-robot 104, including the encoder 404, are connected to a controller 402. The controller 402 is configured to read the encoder value indicated by the encoder 404 and to read the pressure sensed by the pressure sensor 400 upon the occurrence of predetermined conditions. Additionally, if the sensed pressure falls outside the predefined limits (the limits representing acceptable deviation from a properly oriented, level substrate), the controller 402 is programmed or configured to generate an alarm condition.

Figure 5:
FIG. 5 is a graph illustrating the relationship between pressure sensed by a pressure sensor and the distance between the support pin and the substrate.

FIG. 5 illustrates the relationship between pressure sensed by the pressure sensor 400 and the distance between the support pin 108 and the substrate 200. As is evidenced by this graph, as the distance between the substrate 200 and the support pin 108 increases, the pressure sensed by the pressure sensor 400 decreases. Likewise, as the distance between the substrate 200 and the support pin 108 decreases, the pressure sensed by the pressure sensor 400 increases.

Operation of the preferred embodiment of the present invention will now be explained with reference to FIGS. 1–5.

In general, when processing a semiconductor wafer 200, it is important that the wafer 200 is properly present and oriented throughout each step of the process. Specifically, in order to prevent damage to a wafer 200 or the surrounding structures during transfer and semiconductor processing (e.g., CVD, annealing, etching, etc.) elsewhere in the tool, it should be determined whether the wafer 200 is correctly positioned and aligned on the support ring 202. When the wafer 200 is misaligned on a support structure particularly sized to accommodate the wafer 200, the wafer 200 will also be misoriented, which is used herein to indicate a wafer not properly leveled. Towards this end, the preferred embodiment of the present invention provides a method and apparatus for sensing and orienting a wafer 200.

Preferably, a calibration measurement is completed prior to employing the methods taught herein in order to determine the proper vertical position of the elevator-robot 104 for a reference wafer that is correctly positioned, aligned and oriented on the support ring 202. In the calibration process, the elevator-robot 104 extends upwardly in order to receive a wafer 200. When the wafer 200 is ready for processing, it is placed upon the supporting structure 106 atop the support pins 108. Preferably, at that time, fluid is flowing through the fluid channels 300 within the support pins 108 and exiting therefrom. As the wafer 200 approaches, and comes to rest upon the support pins 108, the fluid channels 300 are blocked, and the pressure therein rises. As the pressure within the fluid channels 300 rises, the pressure sensor 400 detects the spike in pressure, and transfers this information to the controller 402. Throughout this process, the bleed aperture 302 provides a path for the pressurized fluid to escape, thereby keeping the pressure within the fluid channel 300 within an acceptable range to avoid lifting the wafer 200 off the pins 108 by the fluid flow. Because the bleed aperture 302 is more restrictive than the main channel 300 in each support pin 108, a pressure increase is still detectable, such that the presence of the wafer 200 can be detected. Once the controller 402 has verified that a wafer 200 has been placed upon the support structure 106, it causes the elevator-robot 104 to vertically translate the substrate support structure 106 downwardly towards the support ring 202.

The substrate support structure 106 proceeds downwardly (or alternatively the support ring 202 moves upwardly) so that the wafer 200 can be deposited on the support ring 202. Upon contact of the wafer 200 with support ridges 204 of the support ring 202, the substrate support table 106 is moved further downwardly away from the wafer 200. At this point, the wafer 200 is supported over the support table 106 but no longer directly supported by the support pins 108 and is instead suspended by the support ring 202 above the support pins 108 of the support table 206. Each pressure sensor 400, connected to a fluid channel 300 of a support pin 108, senses a decrease in pressure, and communicates that information to the controller 402. For each support pin 108 with a pressure sensor 400, an encoder value provided by the encoder 404 is read by the controller 402, at the moment that the pressure sensor 400 senses a predefined pressure in the fluid channel 300 connected to that particular support pin 108. The predefined pressure is selected such that the wafer 200 is spaced apart from, but proximate to the support pin 108. When the wafer is proximate the support pin 108 (FIG. 3C) the pressure measured in the fluid channel 300 critically depends on the distance between the top surface of the support pin 108 and the lower surface of wafer 200.

In this way, encoder values are obtained that correspond with the distances between the properly aligned and level substrate 200 and each of the three supporting pins 108, and thus the encoder values correspond also with the pressure measurement made, with the wafer 200 thus spaced, during the calibration process. These encoder values are the target encoder values in the vertical position for each of the supporting pins for a correctly positioned and oriented wafer. Because most wafers are not completely flat, in use the measured encoder values will show a deviation from the target encoder values. When the measured encoder values for all support pins 108 are within a predefined allowable deviation, correct positioning and orientation of the wafer 200 is established and further processing of the wafer 200 is allowed. The target encoder value for each supporting pin and the allowable deviation values are stored in the controller 402, which is configured to determine whether a wafer can be processed.

For a wafer that is to be processed, a similar measurement as the calibration measurement described above is preferably carried out comprising reading for each support pin the encoder value at the moment that a predefined pressure or overpressure is measured in order to verify its correct position and orientation. The controller 402 then compares the encoder values read with the target encoder values. If the deviation between the actual encoder value and the target encoder value of one or more supporting pins exceeds the allowable deviation, the controller 402 generates an alarm condition, causing prevention of further wafer processing. In this situation, the elevator-robot 104 will move up until the support pins 108 lift the wafer in order to attempt to deposit the wafer 200 on the support ring 202 again. In the preferred embodiment, after several unsuccessful attempts, the elevator-robot 104 moves the wafer 200 back to a position where it can be removed. If the deviation of the read encoder value from the target encoder value of all supporting pins falls inside the allowable deviation, processing of the wafer is accepted and the wafer 200 is moved into a processing chamber.

In this embodiment, a pressure switch can advantageously be used, providing an on/off signal to the controller 402, wherein the switch is adjusted to switch the signal from on to off or vice versa at the predetermined pressure.

In other arrangements of this embodiment, another predefined condition can be chosen to measure the pressure values and encoder values. For example, it is possible to measure at a predetermined encoder value all three pressure values simultaneously and require that the pressure values resemble previously measured pressure values for a correctly positioned and oriented reference wafer 200. The encoder value should be selected such that the wafer 200 is just released from the support pins 108.

It will be clear to one skilled in the art in view of the present disclosure that, instead of measuring the pressure in the fluid channel 300, the magnitude of the fluid flow through the fluid channel 300 can also be measured and used in alternative embodiments. Furthermore, although in the illustrated embodiments a fluid flow is supplied to the fluid channels and supplied to an underside of a substrate, it is also possible to connect the channels to a vacuum pump and remove fluid from an underside of a substrate. When a wafer is present on the pins, a vacuum pressure will be measured and when the wafer is not present on the pins a higher pressure will be measured.

In yet another arrangement, it is not necessary to read encoder values at a predetermined condition but the time delay between the pressure changes measured for each of the pins can be monitored while the support structure is moving and dropping off a wafer.

FIG. 6 depicts a second embodiment of the present invention, illustrating the orientation and positioning of a wafer 200. In this embodiment, a wafer holder 600 accommodates a wafer 200 in a recess within and parallel to its upper surface. Preferably, the wafer holder 600 comprises a plurality of channels 602, which are connected to a fluid supply source 604 and in order to inject fluid beneath the wafer 200. A pressure sensor 400 (FIG. 4) is configured to sense the pressure in a conduit 606 opening into a gap between the wafer holder 600 and an underside of the overlying substrate 200, preferably at a central part of the wafer holder. The wafer 200 is thus supported over the wafer holder 600 while the property (e.g., flow rate or pressure) of the gas flow is measured. A controller 402 (FIG. 4) is provided and configured to read the pressure sensed by the pressure sensor 400.

In the preferred embodiment, the wafer holder 600 is incorporated within a floating wafer reactor, such as the LEVITOR™ RTP Reactor produced by ASM International N.V. Such a reactor is described in International Publication No. WO 00/42638, published Jul. 20, 2000 and entitled DEVICE FOR POSITIONING A WAFER, the disclosure of which is hereby incorporated by reference. In the LEVITOR™ reactor, a wafer is supported uniformly over its entire surface by fluid. In particular, one massive part supports the wafer ejects gas and creates a gas cushion beneath the wafer while a similar second massive part ejects gas to create a gas cushion above the wafer. Thereafter, the wafer is suspended between jets of fluid flowing out of the two wafer holders, which are positioned both above and below the wafer. In other arrangements, the gas flow beneath the wafer need not support the wafer, but can instead be employed for other purposes (e.g., sweep gas to avoid backside deposition). The skilled artisan will appreciate that the sensing structures and method described herein will have utility in such other applications.

In the preferred embodiment of the present invention, the two parts are separated or open during the pressure measurements described below, while surrounding structures (e.g., shoulder of the support structure surrounding the wafer supported within the recess) prevent the wafer from escaping horizontally. Accordingly, the sensing structures and methods described herein do not depend upon the existence of any topside gas flow.

Based on the pressure sensed by the pressure sensor 400, embodiments of the present invention can determine both the correct position and the orientation (horizontal leveling) of a wafer in the wafer holder, and/or its mechanical integrity and curvature. In this fashion, embodiments of the present invention can determine whether or not a wafer 200 is acceptably formed or shaped, positioned and oriented in order to be processed.

Figure 6A:
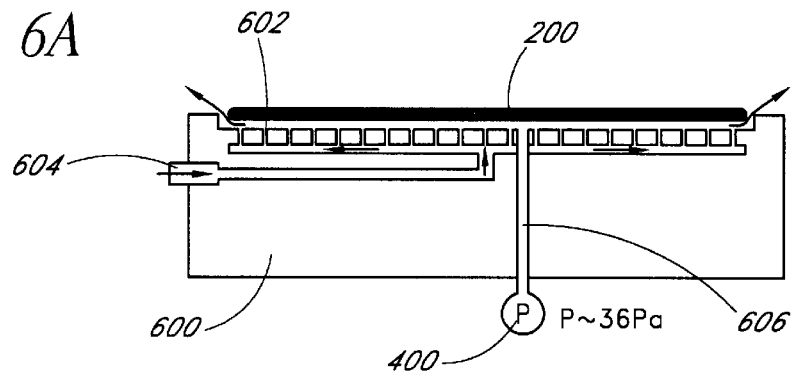
FIGS. 6A, 6B and 6C depict a substrate support and sensing system in accordance with another embodiment of the present invention, illustrating properly oriented, misoriented and absent wafer conditions, respectively.

In this embodiment, predefined pressures are then determined experimentally for different possible scenarios, as shown in FIG. 6. Although the following data is derived only from a single 300 mm silicon wafer for a particular reactor (the LEVITOR™ reactor, commercially available from ASM International N.V. of Bilthoven, The Netherlands), one skilled in the art will recognize that the techniques embodied herein will be equally applicable to wafers of different shapes and sizes, and, consequently, the measured pressures will also be different. It can be calculated that in case of a uniform overpressure at the underside of a wafer, an overpressure of 18 Pa would be sufficient to lift a 300 mm wafer. In case the wafer 200 floats in the recess of the wafer holder 600, a pressure distribution across the wafer 200 is formed, with the highest pressure in the center, and decreasing to approximately zero at the edge of the wafer 200. As illustrated in FIG. 6A, the pressure in the conduit 606 sensed by the pressure sensor 400 has been experimentally measured to be approximately 36 Pa for the correctly positioned wafer 200. The wafer-to-wafer pressure variance typically falls within a few Pa of the expected value of 36 Pa, and is caused by the fact that most wafers are not completely flat.

Figure 6B:
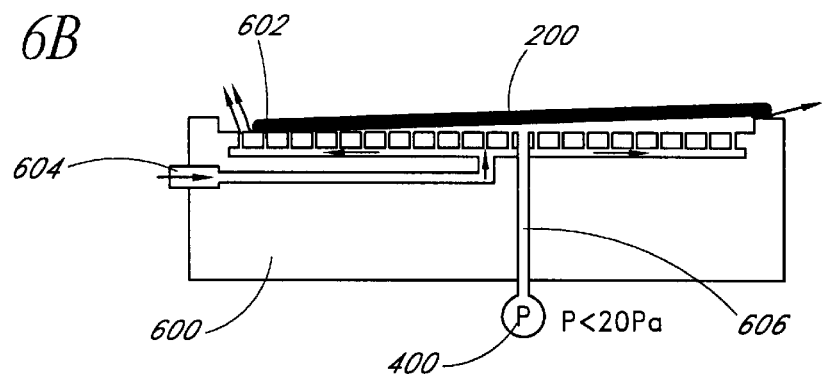
Figure 6C:
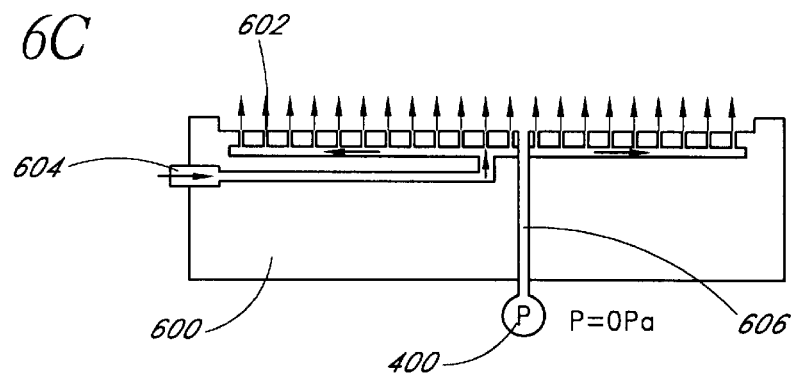

When the wafer 200 is misoriented or tilted, as shown in FIG. 6B, such that one side of the wafer is lying outside the recess, an easier path for the fluid to escape is created. This tilt results in a decrease in pressure measured by the pressure sensor 400 to less than or equal to about 20 Pa, and typically ranging between 10–20 Pa. When no wafer is present (FIG. 6C), the pressure measured by the pressure sensor 400 is about zero.

Figure 7A:
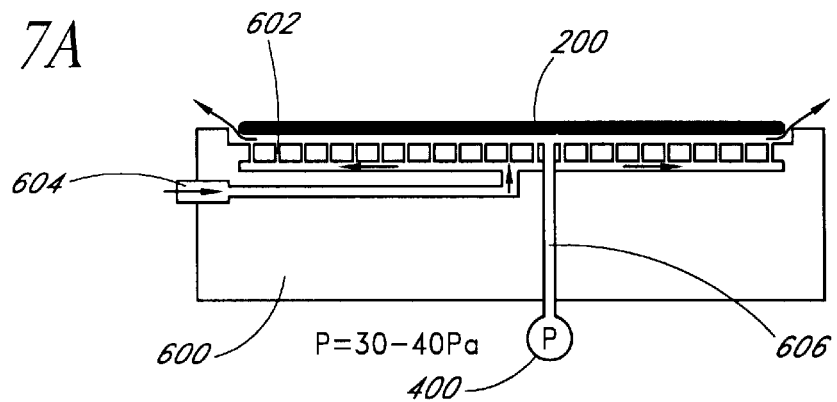
FIGS. 7A, 7B and 7C illustrate flat, convex-up and concave-up wafers, respectively, on the apparatus of FIG. 6.

FIG. 7 depicts another embodiment of the present invention. As previously described, in addition to measuring the correct position and orientation (level) of a wafer 200, the mechanical integrity and the flatness of the wafer 200 can also be determined. As with the previous embodiment, three pressure ranges are specified, corresponding with three different wafer types exhibiting a different mechanical integrity and flatness. As described previously, although the following data is derived only from a single 300 mm silicon wafer for a reactor in which the backside gas ultimately supports the wafer after the reactor parts are closed, and where the pressure is measured near the center of the wafer, one skilled in the art will recognize that the techniques embodied herein will be equally applicable to wafers of different shapes and sizes, and, consequently, the measured pressures will also be different. These pressure ranges have been determined experimentally for the following exemplary scenarios:

FIG. 7A: in the case that the flatness of the wafer is within the tolerance limits, the measured overpressure will range from between about 30 Pa and about 40 Pa.

Figure 7B:
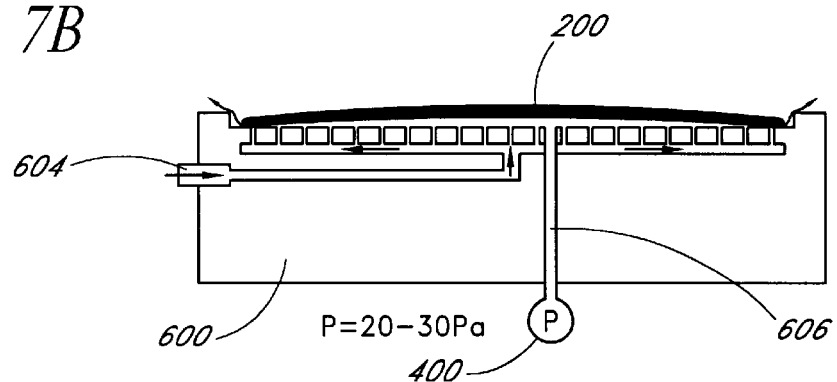

FIG. 7B: in the case that the wafer is convex-up, measured overpressure will range from between about 20 and about 30 Pa.

Figure 7C:
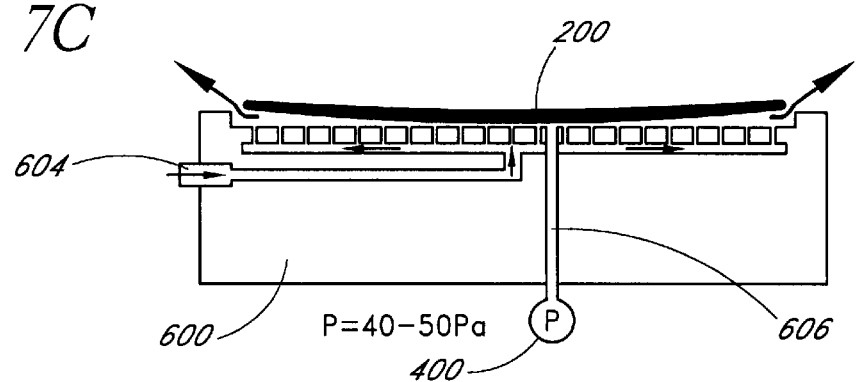

FIG. 7C: in the case that the wafer is concave-up, measured overpressure will range from between about 40 Pa and about 50 Pa.

In the examples above, "overpressure" is used to indicate pressure measured relative to ambient. A pressure sensor typically comprises a membrane with one side exposed to the space in which pressure is to be measured and the other side exposed to a reference space. This reference space can be: (1) an evacuated volume, such that the resultant measurement is effectively an absolute pressure; (2) a reference volume at a fixed pressure, e.g., 1 bar; or (3) ambient. In the illustrated embodiments and exemplary overpressure measurements, the comparison is made against ambient pressure, which is in fact the same as comparing the pressure to the situation where there is no wafer present. The skilled artisan will readily appreciate, however, that the principles and advantages of the methods and apparatuses described herein can be obtained using any suitable pressure or flow rate measurement devices.

As stated above, the pressure values presented here are merely illustrative, and were measured for a specific embodiment of the present invention. Accordingly, pressure values will have to be determined for different embodiments of the present invention depending on such factors as wafer size and thickness, number of channels, viscosity and pressure of the supplied fluid, temperature, pressure of the backside gas, position of the pressure measurement, etc. One skilled in the art will recognize that embodiments of the present invention may be employed in a variety of situations irrespective of the actual pressure values necessary for making the aforementioned determinations.

If it is determined that the measured pressure is appropriate, and indicates a flat wafer properly oriented within the apparatus, the two massive parts are move relative to one another to close the process chamber. In the illustrated embodiment, the substrate is supported by an underlying gas cushion and an overlying gas cushion prevents contact with the upper part. If desired, process gases (e.g., for CVD or etching) may be injected after closing. In some arrangements, the processing conducted within the apparatus is rapid thermal annealing.

It will be appreciated by those skilled in the art that various omissions, additions and modifications may be made to the processes and apparatus described above without departing from the scope of the invention. All such modifications and changes are intended to fall within the scope of the invention, as defined by the appended claims.

We claim:

1. A substrate support and sensing apparatus for use in semiconductor processing, comprising:
   a first substrate support structure, the first support structure comprising at least one fluid channel configured to supply fluid to an underside of a substrate supported over the first support structure;
   at least one sensor configured to measure a property of gas flow beneath the supported substrate and provide a signal indicative of the value of said property; and
   a controller monitoring the signal generated by the sensor, the controller producing an indication of whether the substrate is oriented level relative to the first support structure.

2. The apparatus of claim 1, wherein the property measured is a pressure.

3. The apparatus of claim 1, wherein the property measured is a gas flow rate.

4. The apparatus of claim 1, wherein gas is injected from the fluid channel toward the substrate supported over the first support structure.

5. The apparatus of claim 1, wherein each fluid channel is terminated by a channeled support pin configured to directly support the substrate.

6. The apparatus of claim 5, wherein each channeled support pin further comprises a bleed aperture branching from the fluid channel, the bleed aperture being narrower that the fluid channel.

7. The apparatus of claim 1, comprising at least three fluid channels.

8. The apparatus of claim 7, wherein the property is measured within each of the at least three fluid channels.

9. The apparatus of claim 7, wherein the controller compares values obtained from the property measurements for each of the at least three channels with target values to determine the orientation of the supported substrate.

10. The apparatus of claim 9, wherein the compared values comprise distances between each of the at least three fluid channels and the supported substrate, the distances being calculated from the measured property.

11. The apparatus of claim 1, further comprising a second support structure and a drive mechanism.

12. The apparatus of claim 11, wherein the first and second support structures are vertically movable with respect to each other by the drive mechanism and configured such that a substrate can be transferred between the first and second support structures by movement of the drive mechanism.

13. The apparatus of claim 12, wherein the controller produces an indication of whether the substrate is oriented level relative to the first support structure while the substrate is suspended over the first support structure and is directly supported on the second support structure.

14. The apparatus of claim 13, wherein the controller is configured to control movement of the support structures upon the occurrence of specified conditions.

15. The apparatus of claim 1, wherein the controller further producing an indication of presence/absence of a substrate upon the first support structure.

16. The apparatus of claim 1, wherein the sensor is configured to measure the property within the at least one fluid channel.

17. The apparatus of claim 1, wherein the sensor is configured to measure the pressure at a gap between the supported substrate and the support structure.

18. The apparatus of claim 17, wherein the first support structure comprises a plurality of fluid injection channels configured to supply a supporting cushion beneath the supported substrate.

19. The apparatus of claim 17, wherein the property comprises a pressure.

20. The apparatus of claim 19, wherein the controller compares the measured pressure against a plurality of predetermined pressures associated with a plurality of substrate conditions.

21. The apparatus of claim 20, wherein the controller compares the measured pressure against a plurality of pressure ranges indicating oriented, misoriented and curved conditions.

22. The apparatus of claim 21, wherein the controller is capable of identifying the measured pressure with an convex-up or concave-up curvature of the supported substrate.

23. The apparatus of claim 20, wherein the substrate is a 300 mm wafer, and the controller indicates absence of a wafer with a measured overpressure of about zero.

24. The apparatus of claim 23, wherein the controller indicates a tilted wafer with a measured overpressure between about 10 Pa and 20 Pa.

25. The apparatus of claim 23, wherein the controller indicates a flat and properly oriented wafer with a measured overpressure between about 30 Pa and 40 Pa.

26. The apparatus of claim 23, wherein the controller indicates a convex-up curved wafer with a measured overpressure between about 20 Pa and 30 Pa.

27. The apparatus of claim 26, wherein the controller indicates a concave-up curved wafer with a measured overpressure between about 40 Pa and 50 Pa.

28. A method of supporting and sensing a substrate for use in semiconductor processing, comprising:
supporting a substrate over a first support structure, said structure comprising at least one fluid channel in communication with a gap between the first support structure and an underside of the supported substrate;
flowing fluid through the fluid channel;
measuring a property of the fluid beneath the supported substrate; and
using the measured property to determine one or more of an orientation of the substrate with respect to the first support structure and a shape of the substrate.

29. The method of claim 28, wherein flowing fluid comprises injecting fluid toward the underside of the supported substrate.

30. The method of claim 29, wherein injecting fluid comprises supporting the substrate on a gas cushion within the gap.

31. The method of claim 30, wherein using the measured property comprises comparing the measured property against a plurality of property ranges indicating oriented, misoriented and curved conditions.

32. The method of claim 28, wherein measuring a property of the fluid comprises measuring pressure within each of at least three fluid injection channels beneath the wafer.

33. The method of claim 28, wherein using the measured property comprises determining a distance from the fluid channel to the substrate.

34. The method of claim 33, wherein using the measured property comprises determining a distance from each of a plurality of fluid injection channels to the substrate and comparing the plurality of determined distances to determine whether the substrate is level.

35. The method of claim 34, wherein each of the fluid injection channels terminates in a channeled support pin configured to directly support the substrate.

36. The method of claim 28, further comprising depositing the substrate on a second support structure.

37. The method of claim 28, wherein using the measured property comprises determining a time of occurrence of a substantial change in the measured property within each of a plurality of fluid channels and determining differences in the time of occurrence for the plurality of fluid channels.

38. A system for sensing a condition of a substrate over a support structure, the method comprising:
a substrate holder having an upper surface extending beneath a substrate supported thereover, the upper surface including a recess configured to accommodate the substrate therein;
at least one fluid injection channel which breaches the upper surface to inject fluid into a gap between the substrate and upper surface;
a fluid pressure sensor configured to measure pressure beneath the substrate; and
a controller connected to the pressure sensor and configured to read the pressure sensed by the pressure sensor;
wherein the controller is configured to compare the sensed pressure to a plurality of empirically determined pressure ranges associated with a corresponding plurality of substrate conditions to thereby determine a condition of the substrate based upon the sensed pressure.

39. The system of claim 38, wherein the plurality of pressure ranges include pressure ranges associated with tilt, flatness and curvature of the substrate.

40. The system of claim 39, wherein the plurality of pressure ranges include a pressure range indicating a convex-up curved substrate and a pressure range indicating a concave-up curved substrate.

41. The system of claim 39, wherein the substrate is a 300 mm wafer, and the controller indicates:
   absence of a wafer with a measured overpressure of about zero;
   a tilted wafer with a measured overpressure between about 10 Pa and 20 Pa;
   a flat and properly oriented wafer with a measured overpressure between about 30 Pa and 40 Pa.

42. The system of claim 41, wherein the controller further indicates:
   a convex-up curved wafer with a measured overpressure between about 20 Pa and 30 Pa; and
   a concave-up curved wafer with a measured overpressure between about 40 Pa and 50 Pa.

43. The system of claim 38, wherein the controller is configured to generate an alarm signal when the pressure falls outside predefined limits.

44. The system of claim 43, wherein the substrate comprises a 300 mm wafer and the predefined limits are between about 30 Pa and 40 Pa.

45. The system of claim 38, wherein the substrate is held in fluid suspension above the substrate support surface by fluid emerging from the at least one fluid injection channel.

46. A substrate supporting and sensing apparatus, comprising
   a support structure for receiving and supporting a substantially horizontally oriented substrate;
   a substrate sensing structure provided with at least three gas channels, the gas channels configured to inject gas at spaced apart positions against a lower surface of a substrate supported on the support structure above the substrate sensing structure, each of the gas channels provided with a sensor configured to generate a sensor signal relating to a property of gas flow through the channel; and
   a controller connected to the sensors, the controller configured to read, for each of the sensors, the sensor signal, while the substrate is supported on the support structure, the controller producing from sensor readings an indication of an orientation of a substrate relative to the support structure.

47. The substrate supporting and sensing apparatus of claim 46, wherein the substrate sensing structure is configured to receive and support a substantially horizontally oriented substrate, the substrate sensing structure and the substrate support structure being vertically moveable with respect to each other, such that a substrate supported on one of the structures can be transferred to the other of the support structures.

48. The substrate supporting and sensing apparatus of claim 47, further comprising:
   a drive mechanism to vertically move the substrate sensing structure and the substrate support structure with respect to each other, the drive mechanism provided with an encoder to read the vertical position,
   wherein the controller is connected to the encoder, the controller being configured to read, for each of the sensors, a vertical position indicated by the encoder together with the sensor signal, when a predetermined condition is achieved while the substrate is supported on the substrate support structure.

49. The apparatus of claim 48, wherein the predetermined condition comprises a predetermined pressure indicated by the pressure sensor.

50. The apparatus of claim 48, wherein the predetermined condition comprises a predetermined encoder value.

51. The apparatus of claim 46, wherein the substrate sensing structure comprises three support pins on which a substrate can be mechanically supported, each support pin provided with one of the gas channels.

52. The apparatus of claim 46, wherein the sensor is a pressure sensor.

53. The apparatus of claim 46, wherein the sensor is a pressure switch.

54. The apparatus of claim 46, wherein the sensor is a fluid flow rate sensor.

55. The apparatus of claim 46, where the controller employs a pressure-distance characteristic of each pressure sensor to determine vertical positions for each gas channel and the lower surface of the substrate.

* * * * *